(12) United States Patent
Mukhopadhyay et al.

(10) Patent No.: US 7,304,903 B2
(45) Date of Patent: Dec. 4, 2007

(54) SENSE AMPLIFIER CIRCUIT

(75) Inventors: Saibal Mukhopadhyay, West Lafayette, IN (US); Hamid Mahmoodi, San Francisco, CA (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 11/337,348

(22) Filed: Jan. 23, 2006

(65) Prior Publication Data

US 2007/0171748 A1    Jul. 26, 2007

(51) Int. Cl.
    *G11C 7/00*    (2006.01)
(52) U.S. Cl. .................. 365/205; 365/194; 327/55; 327/57; 327/65
(58) Field of Classification Search .............. 365/194, 365/205; 327/55, 57, 65
    See application file for complete search history.

(56) References Cited

U.S. PATENT DOCUMENTS

| | | | | |
|---|---|---|---|---|
| 6,091,654 | A * | 7/2000 | Forbes et al. | 365/208 |
| 6,462,585 | B1 * | 10/2002 | Bernstein et al. | 327/55 |
| 6,741,104 | B2 * | 5/2004 | Forbes et al. | 327/55 |
| 6,865,129 | B2 * | 3/2005 | Morishima | 365/205 |
| 6,954,391 | B2 * | 10/2005 | Baker | 365/207 |

OTHER PUBLICATIONS

L. Mathew, et al., "CMOS Vertical Multiple Independent Gate Field Effect Transistors (MIGFET)", *2004 IEEE Int. SOI Conference*, Oct. 2004, pp. 187-189.

T. Cakici, et al., "A Low Power Four Transistor Schmitt Trigger for Asymmetric Double Gate Fully Depleted SOI Devices", *IEEE Int. SOI Conference*, 2003, pp. 21-22.

H. Mahmoodi, et al., "High-Performance and Low-Power Domino Logic Using Independent Gate Control in Double-Gate SOI MOSFETs", *2004 IEEE Int. SOI Conference*, Oct. 2004, pp. 67-68.

T. Kobayashi, et al., "A Current-Controlled Latch Sense Amplifier and a Static Power-Saving Input Buffer for Low-Power Architecture," *IEEE J. Solid-State Circuits*, vol. 28, No. 4, Apr. 1993, pp. 523-527.

B. Wicht, et al., "Yield and Speed Optimization of a Latch Type Voltage Sense Amplifier", *IEEE Journal of Solid-State Circuits*, vol. 39, No. 7, Jul. 2004, pp. 1148-1158.

M. Sinha, et al., "High-Performance and Low-Voltage Sense-Amplifier Techniques for sub-90nm SRAM," *Proceedings of IEEE Int. SOC Conference*, Sep. 2003, pp. 113-116.

R. Sarpeshkar, et al., "Mismatch Sensitivity of a Simultaneously Latched CMOS Sense Amplifier", *IEEE Journal of Solid-State Circuits*, vol. 26, No. 10, Oct. 1991, pp. 1413-1422.

(Continued)

*Primary Examiner*—Hoai V. Ho
(74) *Attorney, Agent, or Firm*—Barnes & Thornburg LLP

(57) ABSTRACT

A sense amplifier circuit includes a first double-gate metal oxide semiconductor field effect transistor (DGMOSFET) having a first gate defining a first input to the circuit, a second gate and an output being coupled to a first output of the circuit and a second DGMOSFET having a first gate defining a second input of the circuit, a second gate connected to the output of the first DGMOSFET and an output connected to the second gate of the first DGMOSFET, the output of the second DGMOSFET being coupled to a second output of the circuit.

28 Claims, 4 Drawing Sheets

OTHER PUBLICATIONS

A. Kumar, et al., "Low Voltage and Performance Tunable CMOS Circuit Design Using Independently Driven Double Gate MOSFETs", *2004 IEEE Int. SOI Conference*, Oct. 2004, pp. 119-121.

S. Mukhopadhyay, et al., "Design of High Performance Sense Amplifier Using Independent Gate Control in Sub-50nm Double-Gate MOSFET", Proceedings of the Sixth Int'l Symposium on Quality Electronic Design, Mar. 2005.

* cited by examiner

SENSE AMPLIFIER CIRCUIT

BACKGROUND

The present disclosure relates generally to sense amplifier circuits, and more specifically to sense amplifier circuits used in memory devices.

Sense amplifier circuits are typically used for accessing and reading the contents of memory cells, such as those typically found in static random access memory devices (SRAM). These sense amplifier circuits typically include a number of transistors configured to sense and produce an output indicative of memory cell contents.

SUMMARY

The present invention comprises one or more of the features recited in the appended claims and/or the following features which, alone or in any combination, may comprise patentable subject matter. A sense amplifier circuit may comprise first and second transistors. The first and second transistors may be n-type double-gate metal oxide semiconductor field effect transistors (DGMOSFET's). The first and second transistors may each have a first gate terminal defining a first and second input, respectively, of the sense amplifier circuit. The first and second transistors may each have a second gate terminal. The second gate terminal of the second transistor may be coupled to a first output of the sense amplifier circuit. The second gate terminal of the first transistor may be coupled to a second output of the sense amplifier circuit. The first transistor may have a first output coupled to the first output of the sense amplifier circuit and the second transistor may have a first output coupled to the second output of the sense amplifier circuit.

The first and second gate oxides of the first transistor may have thicknesses different from one another and the first and second gate oxide of the second transistor may have gate oxide thicknesses different from one another. The first gate oxide thicknesses of the first and second transistors may be greater than the oxide thicknesses of the second gates of the first and second transistors, respectively. The first gates of the first and second transistors may have p+ poly workfunctions and the second gates of the first and second transistors may have n+ poly workfunctions.

The sense amplifier circuit may include third and fourth transistors. The third and fourth transistors may be p-type DGMOSFET's. The third and fourth transistors may each have a source terminal connected to a voltage source. The third transistor may have a drain terminal coupled to the first output of the sense amplifier circuit and first and second gate terminals coupled to the second output of the sense amplifier circuit. The fourth transistor may have a drain terminal coupled to the second output of the sense amplifier circuit and first and second gate terminals coupled to the first output of the circuit.

The sense amplifier circuit may further comprise fifth and sixth transistors. The fifth and sixth transistors may be p-type DGMOSFET's. The fifth and sixth transistors may each have a source terminal connected to the voltage source and first and second gate terminals configured for receiving an enable signal for the sense amplifier circuit. The fifth transistor may have a drain terminal coupled to the first output of the sense amplifier circuit and the sixth transistor may have a drain terminal coupled to the second output of the sense amplifier circuit.

The sense amplifier circuit may include a seventh transistor. The seventh transistor may be an n-type DGMOSFET. The seventh transistor may have a source terminal connected to a second output of the first and second transistors. The seventh transistor may have first and second gate terminals configured for receiving the enable signal for the sense amplifier circuit.

The sense amplifier circuit may include first and second inverters. The first inverter may have an input connected to the output of the first transistor and an output defining the first output of the sense amplifier circuit. The second inverter may have an input connected to the output of the second transistor and an output defining the second output of the circuit.

The sense amplifier circuit may be used in a memory device. The memory device may be a static random access memory device (SRAM).

The first input signal of the circuit may comprise a first bit line voltage from a memory cell. The second input signal of the circuit may comprise a second bit line voltage from the memory cell.

The sense amplifier circuit may also include a short-circuit prevention circuit (SCPC). The SCPC may comprise first and second transistors. The first and second transistors may be n-type DGMOSFET's. The first transistor may have an input coupled to the first input signal of the sense amplifier circuit. The first transistor may also have a first gate connected to the second output of the sense amplifier circuit and a second gate and second output connected to ground. The second transistor may have an input coupled to the second input of the sense amplifier circuit and a first gate connected to the first output of the sense amplifier circuit. The second transistor of the SCPC may have a second gate and second output connected to ground.

The SCPC may further comprise a number of inverters connected in series. The number may include an input and an output. The input signal of the number of inverters may be the enable signal for the sense amplifier circuit. The SCPC may further comprise a NAND gate having a first and second input. The first input of the NAND gate may be connected to the output of the number of inverters. The second input may be connected to a column decoder signal line, such as those typically found in memory devices. The SCPC may further comprise a third and fourth transistor. The third and fourth transistors of the SCPC may be p-type DGMOSFET's. The third and fourth transistors may each have first and second gates that are connected to the output of the NAND gate. The third transistor of the SCPC may have a first input connected to the first input of the sense amplifier circuit and an output connected to the first gate of the first transistor of the SCPC. The fourth transistor of the SCPC may have a first input connected to the second input of the sense amplifier circuit and an output connected to the first gate of the second transistor of the SCPC.

DETAILED DESCRIPTION OF THE DRAWINGS

Figure 1:
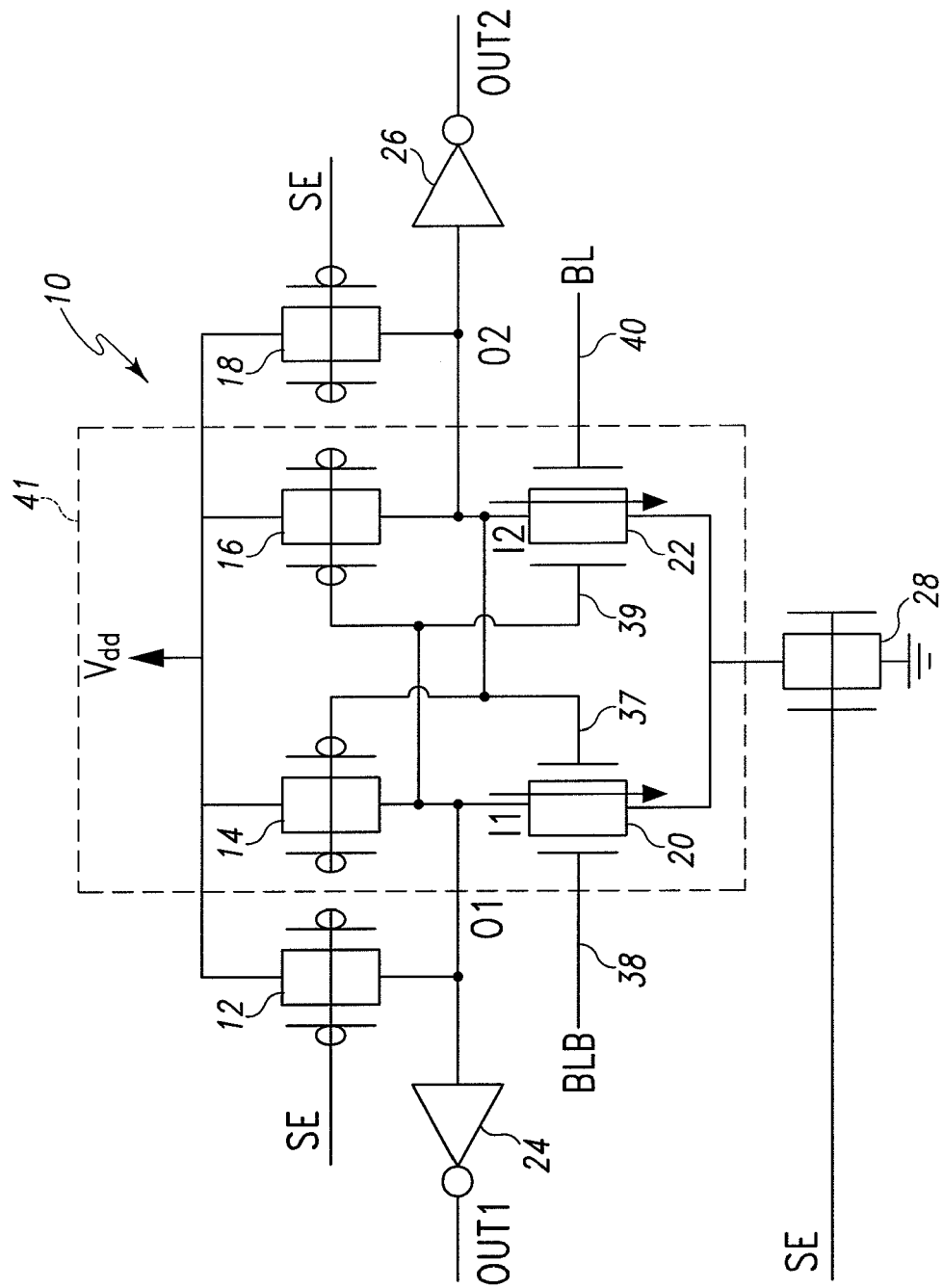
FIG. 1 is a schematic view of an illustrative embodiment of a sense amplifier circuit.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the disclosure.

Referring now to FIG. 1, sense amplifier circuit 10 includes a number of transistors 12-28. In this embodiment, transistors 12-18 are shown to be p-type double-gate metal oxide semiconductor field effect transistors (DGMOSFET's) with the source of each electrically connected to voltage supply $V_{dd}$. As shown in FIG. 1, transistors 12-18, and 28 each have two gates that are electrically connected together so that each transistor 12-18, 28 has a single gate terminal electrically connected to both respective gates. The gates of transistor 20 are each electrically connected to an independently-operated gate terminal 37,38, allowing each gate to receive a voltage that is distinct from the other. Similarly, each gate of transistor 22 is electrically connected to an independently-operated gate terminal 39, 40, each of which are configured similar to those of transistor 20. In this illustrative embodiment, transistors 20, 22 are n-type DGMOSFET's.

Transistors 12 and 14 each have their respective drain terminals electrically connected to the source terminal of transistor 20, where this connection defines a circuit node O1. Transistors 16, 18 each have their respective drain terminals electrically connected to the source terminal of transistor 22, where this connection defines another circuit node O2. The input of an inverter 24 is connected to node O1, and an output OUT1 of inverter 24 provides a first output of sense amplifier circuit 10. Similarly, the input of an inverter 26 is connected to node O2, and an output OUT2 of inverter 26 provides a second output for sense amplifier circuit 10. The gate terminal of transistor 16 and terminal 39 of transistor 22 are electrically connected to node O1, and the gate terminal of transistor 14 and terminal 37 of transistor 20 are electrically connected to node O2. Transistors 14, 16, 20, and 22 serve as a cross-coupled latching inverter circuit 41 in the configuration shown. The inverter circuit 41 ensures that during memory accessing, only one of nodes O1, O2 can be at a voltage of $V_{dd}$ with the other node being at zero volts to provide a logic "high" and "low" signals at the circuit outputs OUT1 and OUT2.

The drain terminals of transistors 20, 22 are each electrically connected to the source terminal of transistor 28 with the drain terminal of transistor 28 electrically connected to ground. An enable signal line, SE, is electrically connected to the gate terminals of transistors 12, 18, 28. A logic "high" enable signal, SE, enables sense amplifier circuit 10, and a logic "low" enable signal, SE, disables sense amplifier circuit 10. A bit line BLB is connected to gate terminal 38 of transistor 20, and a bit line BL is connected to gate terminal 40 of transistor 22. Bit lines BLB, BL typically originate from a memory cell (see FIG. 4) to convey the memory cell contents to the sense amplifier circuit.

During operation, before the bit line voltages BL, BLB are sensed by sense amplifier circuit 10, the enable signal line SE is a logic "low" signal, thereby disabling the sense amplifier circuit 10. In this state, the transistors 12, 18 are turned on in response to the low SE signal applied to the respective gate terminals. Transistors 12, 18 act as precharge transistors by charging both nodes O1, O2 near $V_{dd}$. With enable signal, SE, at a logic "low," transistor 28 is off, thereby providing no current path through the circuit 41 to ground. In this illustrative example, the memory cell (see FIG. 4) is configured to produce a bit line voltage, BLB, of $V_{dd}$ and a bit line voltage, BL, of $V_{dd}-\Delta$, where $\Delta$ is small relative to $V_{dd}$ so that $V_{dd}-\Delta$ is slightly less than $V_{dd}$. The voltage $\Delta$ may, for example, be 10% of $V_{dd}$, although other $\Delta$ voltages are contemplated. Alternatively, the memory cell may be configured to produce a bit line voltage BL of $V_{dd}$ and a bit line voltage BLB of $V_{dd}-\Delta$. In this illustrative example, the bit line voltages applied to gate terminals 38, 40 are therefore $V_{dd}$ (BLB) and $V_{dd}-\Delta$ (BL), respectively.

When enable signal SE switches to a logic "high," transistors 12, 18 turn off in response, thereby isolating nodes O1, O2 from the supply voltage $V_{dd}$, and transistor 28 turns on in response. Nodes O1, O2 remain at $V_{dd}$. Initially, the voltages at nodes O1 and O2 are applied to gates 37, 39 of transistors 20, 22, respectively, and the voltages of bit lines BLB and BL are applied to gate terminals 39, 40 of transistors 20, 22, respectively. When the enable signal, SE, switches to a logic "high", the transistor 28 turns on, thereby, pulling the sources of transistors 20, 22 near ground potential. This causes both transistors 20, 22 to turn on, resulting in the flow of current I1 from node O1 through transistor 20 and the flow of current I2 from node O2 through transistor 22. The voltages at nodes O1, O2 thus begin discharging through transistors 20, 22, respectively, thereby decreasing the voltages to the gate terminals 37, 39 of transistors 20, 22, respectively. However, since bit lines BLB and BL are independently applying voltage to the gate terminals 38, 40 of the transistors 20, 22, the transistors 20, 22 remain on regardless of the amount of voltage decrease at gate terminals 37, 39. Also, since bit line BLB has a voltage higher than that of bit line BL, the voltage at gate terminal 38 of transistor 20 is higher than that of gate terminal 40 of transistor 22, resulting in the condition I1>I2. This causes the voltage at node O1 to discharge more quickly than the voltage at node O2.

As the voltage at node O1 approaches decrease, p-type transistor 16 begin to turn on, thereby charging node O2 from the supply voltage $V_{dd}-\Delta$. When the voltage at O1 is fully discharged, the transistor 16 will be fully turned on, which maintains the transistor 14 in its off state and which maintains node O2 fully charged near $V_{dd}$. At this point in the operation of sense amplifier circuit 10, output OUT1 will therefore be a logic high and output OUT2 will be a logic low. The outputs OUT1 and OUT2 thus reflect the current contents of the memory cell.

Since node O2 is biased near $V_{dd}$ by transistor 16 and since the bit line voltage BL applied at gate terminal 40 is $V_{dd}-\Delta$, the current I2 will continue to flow through transistor 22 while the voltage of the enable signal SE remains high. In various applications of sense amplifier circuit 10, enable signal SE will switch to a logic low quickly during the memory cell accessing, which turns off the transistor 28, thereby inhibiting the flow of current I2 through transistor 22. However, such current is typically undesirable. Eliminating, or at least lowering, this "short-circuit current" I2 flowing through transistor 22 (or transistor 20, depending on bit line voltages) will reduce unnecessary power consumption.

Figure 2:
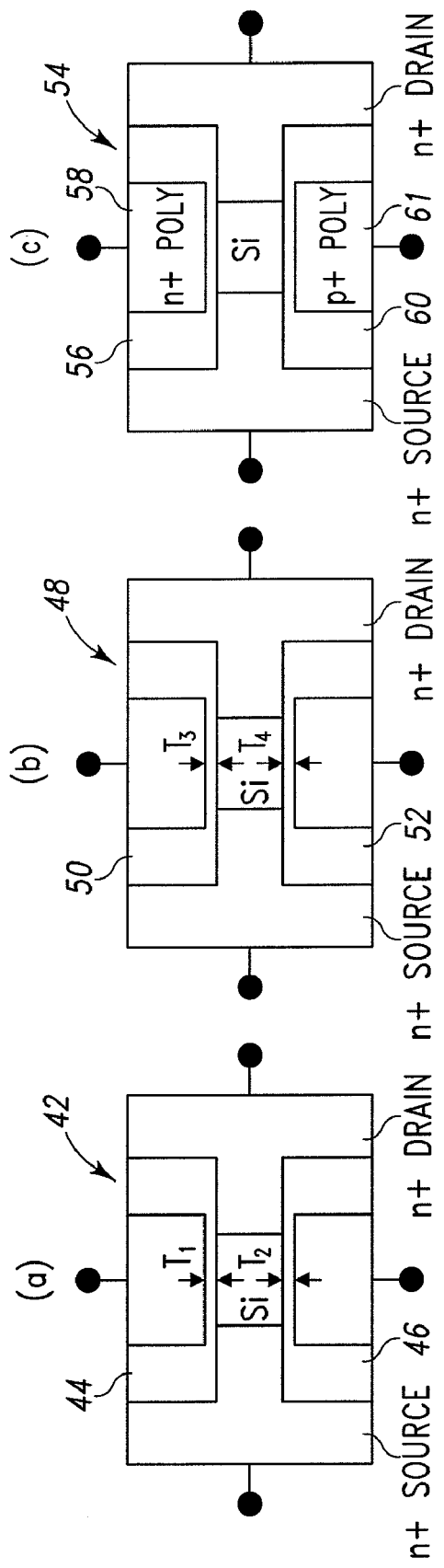
FIG. 2(a) is a schematic view of an illustrative double-gate metal oxide semiconductor field effect transitor (DG-MOSFET).
FIG. 2(b) is a schematic view of an illustrative DGMOSFET having front and back oxide thicknesses different from one another.
FIG. 2(c) is a schematic view of an illustrative DGMOSFET having front and back gate material work functions different from one another.

In one embodiment of an illustrative sense amplifier circuit, transistors 20, 22 includes gate oxides of different thicknesses. FIG. 2(a) is a schematic view of a DGMOSFET 42 with gates, 44, 46 having oxide thicknesses T1, T2 that are substantially equal to one another. The source and drain materials are shown to be n+ with silicon disposed therebetween. This type of transistor may be used for transistors 20, 22 in the illustrative embodiment of sense amplifier 10 shown in FIG. 1.

FIG. 2(b) is a schematic view of an illustrative DGMOSFET 48 with gates 50, 52 having oxide thicknesses T3, T4, with T3<T4. DGMOSFET 48 has source and drain material similar to that of DGMOSFET 42. Transistors such as DGMOSFET 48 used as transistors 20, 22 in sense amplifier circuit 10 will reduce the short-circuit current described above. When used in a sense amplifier circuit such as sense amplifier circuit 10, gate 52 is used for bit line input, BL or BLB.

FIG. 2(c) is a schematic of an illustrative DGMOSFET 54, having gate materials different from one another. DGMOSFET 48 has source and drain material similar to that of DGMOSFET 42. Gate 56 includes gate material 58 having a workfunction that is n+ poly. Gate 60 includes gate material 61 having a workfunction that is p+ poly. Transistors such as DGMOSFET 54 used in sense amplifier circuit 10 as transistors 20, 22, reduce short-circuit current and conserve power. When used in a sense amplifier circuit, gate 60 is used for bit line input, BL or BLB.

Figure 3:
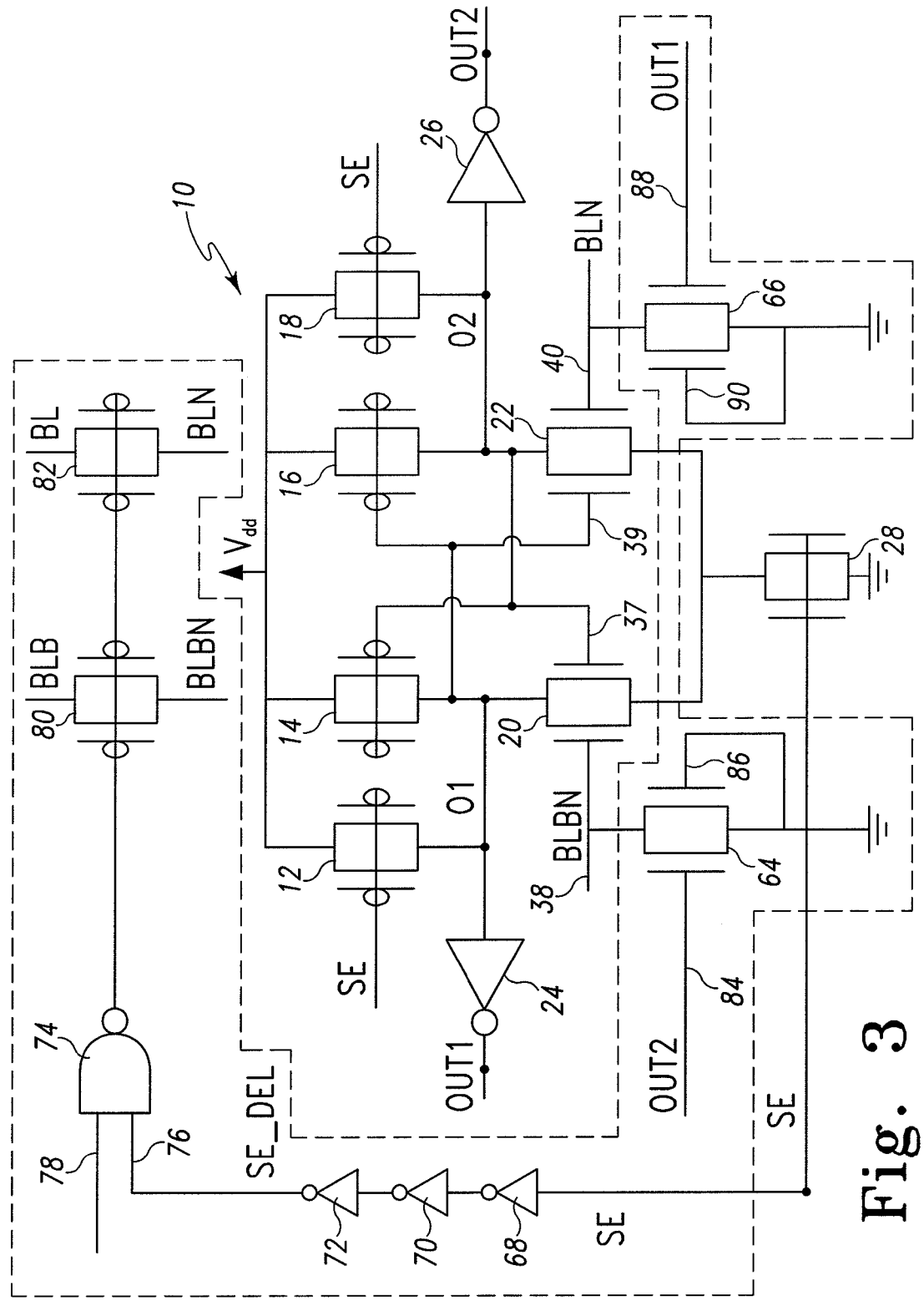
FIG. 3 is a schematic view of another illustrative embodiment of a sense amplifier circuit.

In other illustrative embodiments, a short-circuit prevention circuit (SCPC) can be used to reduce short circuit current in sense amplifier circuit 10. FIG. 3 shows a schematic of sense amplifier circuit 10 using SCPC 62, which includes transistors 64, 66. In this illustrative embodiment, transistors 64, 66 are shown to be n-type DGMOSFET's.

SCPC 62 also includes inverters 68-72, which are electrically connected in series. The input of inverter 68 is electrically connected to enable signal line SE. The output of inverter 72 is electrically connected to an input 76 of NAND gate 74. Input 78 of NAND gate 74 is typically electrically connected to a column decoder signal, which is available in many memory devices compatible with sense amplifier circuit 10. The output of NAND gate 78 is electrically connected to the gate terminals of transistors 80, 82. In this illustrative embodiment, transistors 80, 82 are p-type DGMOSFET's. The source terminal of transistor 80 is electrically connected to bit line BL and the source terminal of transistor 82 is electrically connected to bit line BLB.

Gate terminal 84 of transistor 64 is connected to the second output OUT2 of sense amplifier circuit 10. Gate terminal 86 of transistor 64 is connected to the drain terminal, which is connected to ground. The source terminal of transistor 64 is coupled to the drain terminal of transistor 80, which serves as signal line BLBN. Gate terminal 38 of transistor 20 is also coupled to the drain terminal of transistor 80. Gate terminal 88 of transistor 66 electrically connected to the first output OUT1 of sense amplifier circuit 10. Gate terminal 90 of transistor 66 is electrically connected to the drain terminal, which is connected to ground. The source terminal of transistor 66 is coupled to the drain terminal of transistor 82, which serves as signal line BLN. Gate 40 of transistor 22 is also coupled to the drain terminal of transistor 82.

During operation, sense amplifier circuit 10 functions in the manner described previously regarding FIG. 1. Nodes O1 and O2 are precharged to $V_{dd}$ through transistors 10, 16. In this embodiment, similar to that of FIG. 1, bit line voltages BLB, BL are $V_{dd}$ and $V_{dd}-\Delta$, respectively. Enable line signal SE will begin at a logic low, which results in signal SE_DEL being high. Input 78 of NAND gate 74 will be low, which turns on transistors 80, 82. This allows the bit line voltages BLB, BL to be applied to gates 38, 40 of transistors 20, 22, respectively.

Enable line SE will eventually provide a logic high signal. This allows nodes O1, O2 to begin discharging. With enable line SE high, the SE_DEL signal will be a logic low. Input 78 is high, which produces a low output at NAND gate 74, which turns on p-type transistors 80, 82. This cuts off the bit line voltages BLB, BL from sense amplifier circuit 10. At the initial cut-off, signal BLBN will be at a voltage of $V_{dd}$ and signal BLN will be at voltage of $V_{dd}-\Delta$.

Sense amplifier circuit 10 will operate in substantially the same manner as described regarding FIG. 1. Nodes O1, O2 will discharge, and in this embodiment, the cross-coupling effect will occur such that node O1 is at 0 volts and node O2 is at $V_{dd}$. This causes output OUT1 to provide a logic high signal and output OUT2 to provide a logic low signal.

In the illustrative example of FIG. 1, the occurrence of short-circuit current was described. In this illustrative embodiment, SCPC removes the short-circuit current. When enable line SE provides a high signal, the signal is inverted by inverters 68-70, which provides a low signal to input 76 of NAND gate 74. With input 78 providing a high signal, NAND gate 74 has a high signal at its output, which turns off transistors 80, 82. This isolates BLBN from BLB and BLN from BL, but only after a delay due to the operation times of inverters 68-72, NAND gate 74, and transistors 80, 82; This gives sense amplifier circuit 10 time to read memory cell contents and provide them at its outputs OUT1, OUT2. In this illustrative embodiment, only transistor 22 will experience short-circuit current due to O2 being at $V_{dd}$. However, gate terminal 88 of transistor 66 is coupled to output OUT1, which provides a logic high and turns on transistor 66. This causes the voltage at gate terminal 88 to discharge through transistor 66, thus reducing the gate voltage of transistor 22 to zero, turning off transistor 22. This cuts off the current path to ground before enable signal line SE provides a low signal, and thus eliminates short-circuit current and unnecessary power consumption. It is to be appreciated that when bit line BLB is at a voltage of $V_{dd}-\Delta$ and bit line BL is at a voltage of $V_{dd}$, transistor 64 will allow the voltage at gate terminal 38 of transistor 20 to be discharged through it to eliminate short-circuit current in a manner similar to that described.

Figure 4:
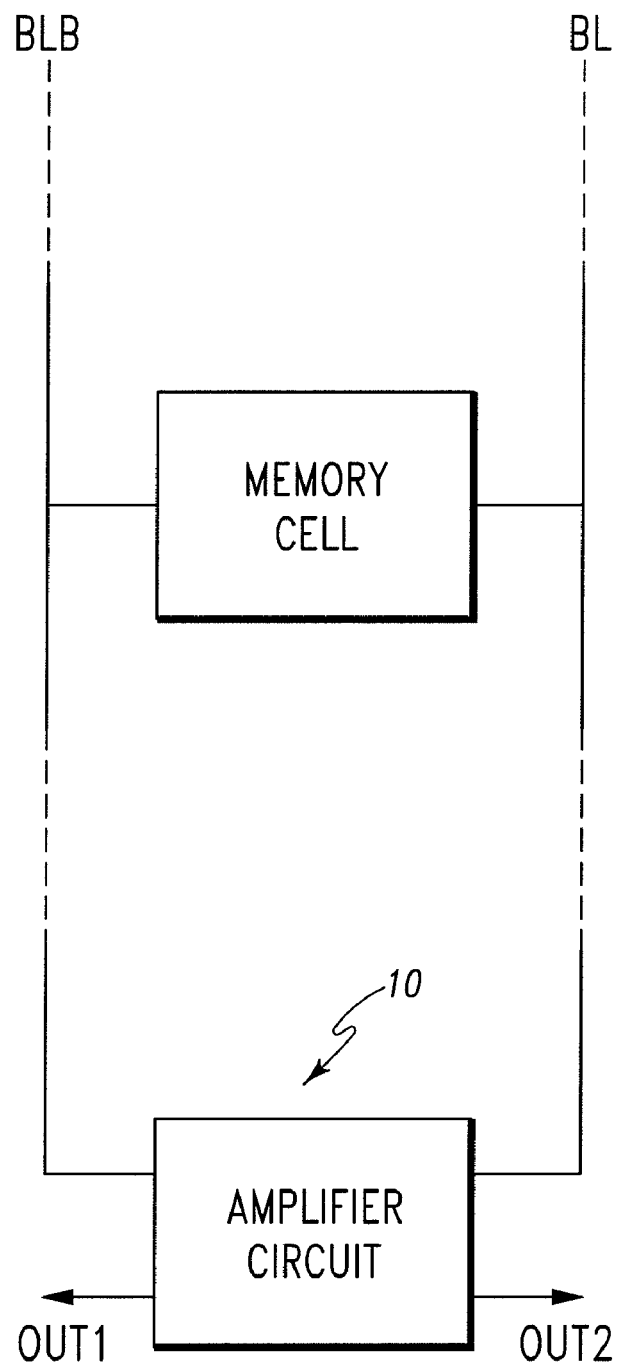
FIG. 4 is an illustrative representation of memory cell connected to a sense amplifier circuit.

FIG. 4 shows an illustrative representation of sense amplifier circuit 10 coupled to a memory cell 100 through bit lines BLB and BL. Sense amplifier circuit 10 can be used in memory devices such as static random access memory devices (SRAM), for example. In this illustrative embodiment, the memory cell 100, when prompted, will provide bit line voltages corresponding to the contents of memory cell 100. Outputs OUT1 and OUT2 ultimately provide a logic high and low based upon the bit line voltages providing the contents of memory cell 100 for use.

There are a plurality of advantages of the present disclosure arising from the various features of the methods, circuits, and devices described herein. It will be noted that alternative embodiments of the methods, circuits, and devices of the present disclosure may not include all of the features described yet still benefit from at least some of the advantages of such features. Those of ordinary skill in the art may readily devise their own implementations of the methods, circuits, and devices that incorporate one or more of the features of the present invention and fall within the spirit and scope of the present disclosure as defined by the appended claims.

What is claimed is:

1. A sense amplifier circuit comprising:
   a first double-gate MOSFET (DGMOSFET) having a first gate defining a first input to the circuit, a second gate and an output being coupled to a first output of the circuit; and
   a second DGMOSFET having a first gate defining a second input of the circuit, a second gate connected to the output of the first DGMOSFET and an output connected to the second gate of the first DGMOSFET, the output of the second DGMOSFET being coupled to a second output of the circuit;
   a third DGMOSFET having a first and second gates connected to the second gate of the first DGMOSFET and coupled to the second output of the circuit, an input configured to be connected to a voltage supply, and an output coupled to the first output of the circuit; and
   a fourth DGMOSFET having first and second gates connected to the second gate of the second DGMOSFET and coupled to the first output of the circuit, an input configured to be connected to a voltage supply, and an output coupled to the second output of the circuit.

2. The sense amplifier circuit of claim 1, further comprising a voltage supply; wherein, the input of the third DGMOSFET and the input of the fourth DGMOSFET are each connected to the voltage supply.

3. The sense amplifier circuit of claim 2, further comprising:
   a fifth DGMOSFET having first and second gates connected to an enable signal line, an input connected to the voltage supply, and an output coupled to the first output of the circuit; and
   a sixth DGMOSFET having first and second gates connected to the enable signal line, an input connected to the voltage supply, and an output coupled to the second output of the circuit.

4. The sense amplifier circuit of claim 3, further comprising a seventh DGMOSFET having first and second gates connected to the enable signal line, an input connected to another output of the first DGMOSFET and another output of the second DGMOSFET, and an output connected to ground.

5. The sense amplifier circuit of claim 4, further comprising a first inverter having an input connected to the output of the first DGMOSFET and an output defined as the first output of the circuit; and
   a second inverter having an input connected to the output of the second DGMOSFET and an output defined as the second output of the circuit.

6. The sense amplifier circuit of claim 1, further comprising a first signal comprising a voltage of a first bit line of a memory cell, the first bit line connected to the first input of the circuit; and
   a second input signal comprising a voltage of a second bit line of the memory cell, the second bit line connected to the second input of the circuit.

7. The sense amplifier circuit of claim 1, wherein the first and second gates of the first DGMOSFET have oxide thicknesses different from one another and the first and second gates of the second DGMOSFET have oxide thicknesses different from one another.

8. The sense amplifier circuit of claim 7, wherein the oxide thickness of the first gate of the first DGMOSFET is greater than the oxide thickness of the second gate of the first DGMOSFET; and
   wherein, the oxide thickness of the first gate of the second DGMOSFET is greater than the oxide thickness of the second gate of the second DGMOSFET.

9. The sense amplifier circuit of claim 6, wherein the first gates of the first and second DGMOSFET's have p+ poly workfunctions and the second gates of the first and second DGMOSFET's have n+ poly workfunctions.

10. The sense amplifier circuit of claim 1, further comprising a short-circuit prevention circuit (SCPC) configured to prevent short-circuit current flowing through the first and second DGMOSFET's.

11. The sense amplifier circuit of claim 10, wherein the SCPC comprises a first DGMOSFET having a first gate connected to the second output of the sense amplifier circuit, a second gate and an output connected to ground, and an input coupled to the first input of the sense amplifier circuit;
   a second DGMOSFET having a first gate connected to the first output of the sense amplifier circuit, a second gate and an output connected to ground, and an input coupled to the first input of the sense amplifier circuit; and
   a delay circuit.

12. The sense amplifier circuit of claim 11, wherein the delay circuit comprises a number of inverters connected in series with one another, the number of inverters having an input and an output with the input of the number of inverters connected to an enable signal line; and
   a NAND gate having a first input coupled to the output of the number of inverters, a second output coupled to a column decoder signal line, and an output coupled to first and second inputs of the sense amplifier circuit.

13. The sense amplifier circuit of claim 12, wherein the delay circuit further comprises a third DGMOSFET having first and second gates connected to the output of the NAND gate, an input connected to a first bit line of a memory cell, and an output connected to the first input of the sense amplifier circuit; and
   a fourth DGMOSFET having first and second gates connected to the output of the NAND gate, an input connected to a second bit line of a memory cell, and an output connected to the second input of the sense amplifier circuit.

14. A memory device comprising:
   a number of memory cells, each connected to a first and second bit line; and
   a sense amplifier circuit comprising:
   a first double-gate MOSFET (DGMOSFET) having a first gate defining a first input to the circuit and connected to the first bit line, a second gate and an output being coupled to a first output of the circuit,
   a second DGMOSFET having a first gate defining a second input of the circuit and connected to the second bit line, a second gate connected to the output of the first DGMOSFET and an output connected to the second gate of the first DGMOSFET, the output of the second DGMOSFET being coupled to a second output of the circuit;
   a third DGMOSFET having a first and second gates connected to the second gate of the first DGMOSFET and coupled to the second output of the circuit, an input configured to be connected to a voltage supply, and an output coupled to the first output of the circuit; and a fourth DGMOSFET having first and second gates connected to the second gate of the second DGMOS-FET and coupled to the first output of the circuit, an input configured to be connected to a voltage supply, and an output coupled to the second output of the circuit.

15. The memory device of claim 14, wherein the sense amplifier circuit further comprises
a voltage supply;
where, the input of the and the input of the fourth DGMOSFET are each connected to the voltage supply.

16. The memory device of claim 15, wherein the sense amplifier circuit further comprises:
a fifth DGMOSFET having first and second gates connected to an enable signal line, an input connected to the voltage supply, and an output coupled to the first output of the circuit; and
a sixth DGMOSFET having first and second gates connected to the enable signal line, an input connected to the voltage supply, and an output coupled to the second output of the circuit.

17. The memory device of claim 16, wherein the sense amplifier circuit further comprises a seventh DGMOSFET having first and second gates connected to the enable signal line, an input connected to another output of the first DGMOSFET and another output of the second DGMOS-FET, and an output connected to ground.

18. The memory device of claim 17, wherein the sense amplifier circuit further comprises a first inverter having an input connected to the output of the first DGMOSFET and an output defined as the first output of the circuit; and
a second inverter having an input connected to the output of the second DGMOSFET and an output defined as the second output of the circuit.

19. The memory device of claim 18, further comprising a first input signal comprising a voltage of the first bit line of a memory cell; and
a second input signal comprising a voltage of the second bit line of the memory cell.

20. The memory device of claim 14, wherein the first and second gates of the first DGMOSFET have oxide thicknesses different from one another and the first and second gates of the second DGMOSFET have oxide thicknesses different from one another.

21. The memory device of claim 20, wherein the oxide thickness of the first gate of the first DGMOSFET is greater than the oxide thickness of the second gate of the first DGMOSFET; and
wherein, the oxide thickness of the first gate of the second DGMOSFET is greater than the oxide thickness of the second gate of the second DGMOSFET.

22. The memory device of claim 14, wherein the first gates of the first and second DGMOSFET's have p+ poly workfunctions and the second gates of the first and second DGMOSFET's have n+ poly workfunctions.

23. The memory device of claim 14, further comprising a short-circuit prevention circuit (SCPC) configured to prevent short-circuit current flowing through the first and second DGMOSFET's.

24. The memory device of claim 23, wherein the SCPC comprises a first DGMOSFET having a first gate connected to the second output of the sense amplifier circuit, a second gate and an output connected to ground, and an input coupled to the first input of the sense amplifier circuit;
a second DGMOSFET having a first gate connected to the first output of the sense amplifier circuit, a second gate and an output connected to ground, and an input coupled to the first input of the sense amplifier circuit; and
a delay circuit.

25. The memory device of claim 24, wherein the delay circuit comprises a number of inverters connected in series with one another, the number of inverters having an input and an output with the input of the number of inverters connected to enable signal line; and
a NAND gate having a first input coupled to the output of the number of inverters, a second output coupled to a column decoder signal line, and an output coupled to first and second inputs of the sense amplifier circuit.

26. The memory device of claim 25, wherein the delay circuit further comprises a third DGMOSFET having first and second gates connected to the output of the NAND gate, an input connected to a first bit line of a memory cell, and an output connected to the first input of the sense amplifier circuit; and
a fourth DGMOSFET having first and second gates connected to the output of the NAND gate, an input connected to a second bit line of a memory cell, and an output connected to the second input of the sense amplifier circuit.

27. The memory device of claim 15, wherein each of the number of memory cells is a static random access memory cell (SRAM).

28. A method for reading the contents of a memory cell having first and second bit lines, the steps comprising:
providing a sense amplifier circuit having first second, third, and fourth DGMOSFET's
coupling an output of the first DGMOSFET to a first output of the sense amplifier circuit and a first gate of the first DGMOSFET to a second output of the sense amplifier circuit;
coupling an output of the second DGMOSFET to the second output of the sense amplifier circuit and a first gate of the second DGMOSFET to the first output of the sense amplifier circuit;
coupling a first and second sate of the third DGMOSFET to a second sate of the first DGMOSFET and to the second output of the sense amplifier circuit;
coupling a first and second gate of the fourth DGMOS-FET to a second gate of the second DGMOSFET and to the first output of the sense amplifier circuit;
applying a first bit line voltage to a second gate terminal of the first DGMOSFET and a second bit line voltage to the second gate of the second DGMOSFET; and
providing first and second output signals at the first and second outputs of the sense amplifier circuit indicative of the memory cell contents.

* * * * *